United States Patent
Mikawa et al.

(10) Patent No.: US 12,417,802 B2
(45) Date of Patent: Sep. 16, 2025

(54) SEMICONDUCTOR DEVICE AND METHOD OF DRIVING THE SAME

(71) Applicant: Panasonic Corporation, Osaka (JP)

(72) Inventors: Takumi Mikawa, Shiga (JP); Koji Katayama, Nara (JP); Ryutaro Yasuhara, Hyogo (JP)

(73) Assignee: PANASONIC HOLDINGS CORPORATION, Osaka (JP)

( * ) Notice: Subject to any disclaimer, the term of this patent is extended or adjusted under 35 U.S.C. 154(b) by 860 days.

(21) Appl. No.: 17/691,733

(22) Filed: Mar. 10, 2022

(65) Prior Publication Data

US 2022/0198251 A1    Jun. 23, 2022

Related U.S. Application Data

(63) Continuation of application No. PCT/JP2021/002106, filed on Jan. 21, 2021.

(30) Foreign Application Priority Data

Jan. 24, 2020    (JP) .................... 2020-010097

(51) Int. Cl.
*G11C 11/54* (2006.01)
*G06N 3/065* (2023.01)
*G11C 13/00* (2006.01)

(52) U.S. Cl.
CPC .............. *G11C 11/54* (2013.01); *G06N 3/065* (2023.01); *G11C 13/0007* (2013.01)

(58) Field of Classification Search
CPC ................ G11C 11/54; G11C 13/0007; G11C 2013/0045; G06N 3/065; G06F 12/00

USPC .................................... 365/148, 158
See application file for complete search history.

(56) References Cited

U.S. PATENT DOCUMENTS

| 6,418,049 B1 | 7/2002 | Kozicki et al. |
| 10,482,953 B1 * | 11/2019 | Lin ................ G11C 11/5657 |
| 10,784,313 B1 * | 9/2020 | Gong ..................... G11C 11/54 |
| 11,600,325 B2 * | 3/2023 | Chen .................... G11C 13/0011 |
| 2013/0062588 A1 | 3/2013 | Sakotsubo |
| 2015/0016177 A1 | 1/2015 | Matsunami |

(Continued)

FOREIGN PATENT DOCUMENTS

| JP | 2001-525606 A | 12/2001 |
| JP | 2013-058691 A | 3/2013 |

(Continued)

OTHER PUBLICATIONS

International Search Report issued on Apr. 13, 2021 in International Patent Application No. PCT/JP2021/002106, with English translation.

(Continued)

*Primary Examiner* — Michael T Tran
(74) *Attorney, Agent, or Firm* — Rimon P.C.

(57) ABSTRACT

A semiconductor device includes variable resistance elements on a semiconductor substrate. Each of the variable resistance elements includes a first electrode, a second electrode, and a variable resistance layer that is sandwiched between the first electrode and the second electrode and that stores a resistance value that is continuously variable. The variable resistance layer includes a filament whose shape differs according to a neural network weight, and stores, as an analog value, the resistance value that is variable.

15 Claims, 20 Drawing Sheets

| Weight W (= 1/R) | Filament shape | Electric pulse |
|---|---|---|
| Ws (= 1/Rs) | Ss | Vs |
| : | : | : |
| W1 (= 1/R1) | S1 | V1 |
| : | : | : |
| W2 (= 1/R2) | S2 | V2 |
| : | : | : |
| W3 (= 1/R3) | S3 | V3 |
| : | : | : |
| We (= 1/Re) | Se | Ve |

(56) References Cited

U.S. PATENT DOCUMENTS

| | | | |
|---|---|---|---|
| 2017/0270404 A1 | 9/2017 | Eleftheriou et al. | |
| 2018/0082168 A1* | 3/2018 | Marukame | G06N 3/065 |
| 2020/0104694 A1* | 4/2020 | Nikonov | H03B 7/00 |
| 2020/0202925 A1 | 6/2020 | Hayata et al. | |
| 2020/0293594 A1* | 9/2020 | Raissi | G06F 30/27 |
| 2020/0293889 A1* | 9/2020 | Terasaki | G06N 3/065 |
| 2022/0366227 A1* | 11/2022 | Lee | G06N 3/065 |

FOREIGN PATENT DOCUMENTS

| | | |
|---|---|---|
| JP | 2015-018591 A | 1/2015 |
| JP | 2018-166194 A | 10/2018 |
| JP | 2019-519011 A | 7/2019 |
| WO | 99/28914 A2 | 6/1999 |
| WO | 2017/163139 A1 | 9/2017 |
| WO | 2019/049686 A1 | 3/2019 |

OTHER PUBLICATIONS

M. Prezioso et al., "Training and operation of an integrated neuromorphic network based on metal-oxide memristors," Nature, vol. 521, May 7, 2015, pp. 61-64.

B. Gao et al., "Modeling Disorder Effect of the Oxygen Vacancy Distribution in Filamentary Analog RRAM for Neuromorphic Computing," 2017 IEEE International Electron Devices Meeting (IEDM), Dec. 2017, pp. 91-94.

S. Muraoka et al., "Comprehensive Understanding of Conductive Filament Characteristics and Retention Properties for Highly Reliable ReRam," 2013 Symposium on VLSI Technology Digest of Technical Papers, 2013, pp. 62-63.

Office Action mailed on Nov. 5, 2024 for the corresponding Japanese patent application No. 2021-572801, w/English Translation.

* cited by examiner

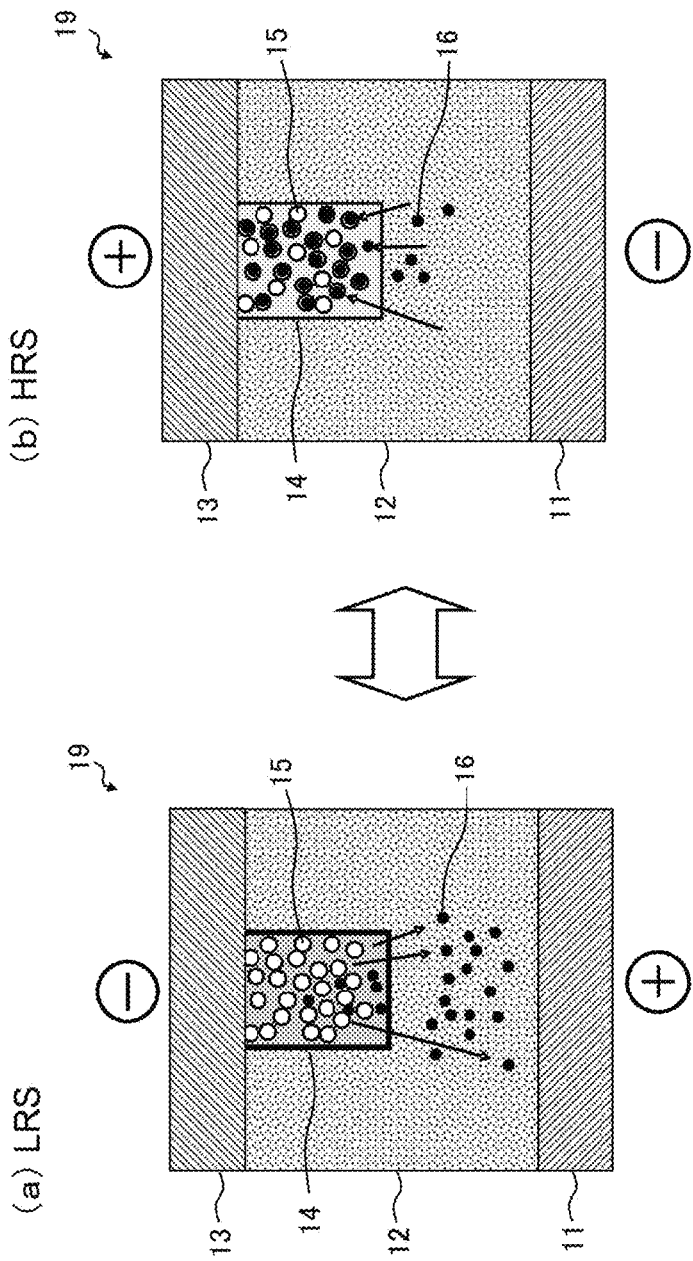

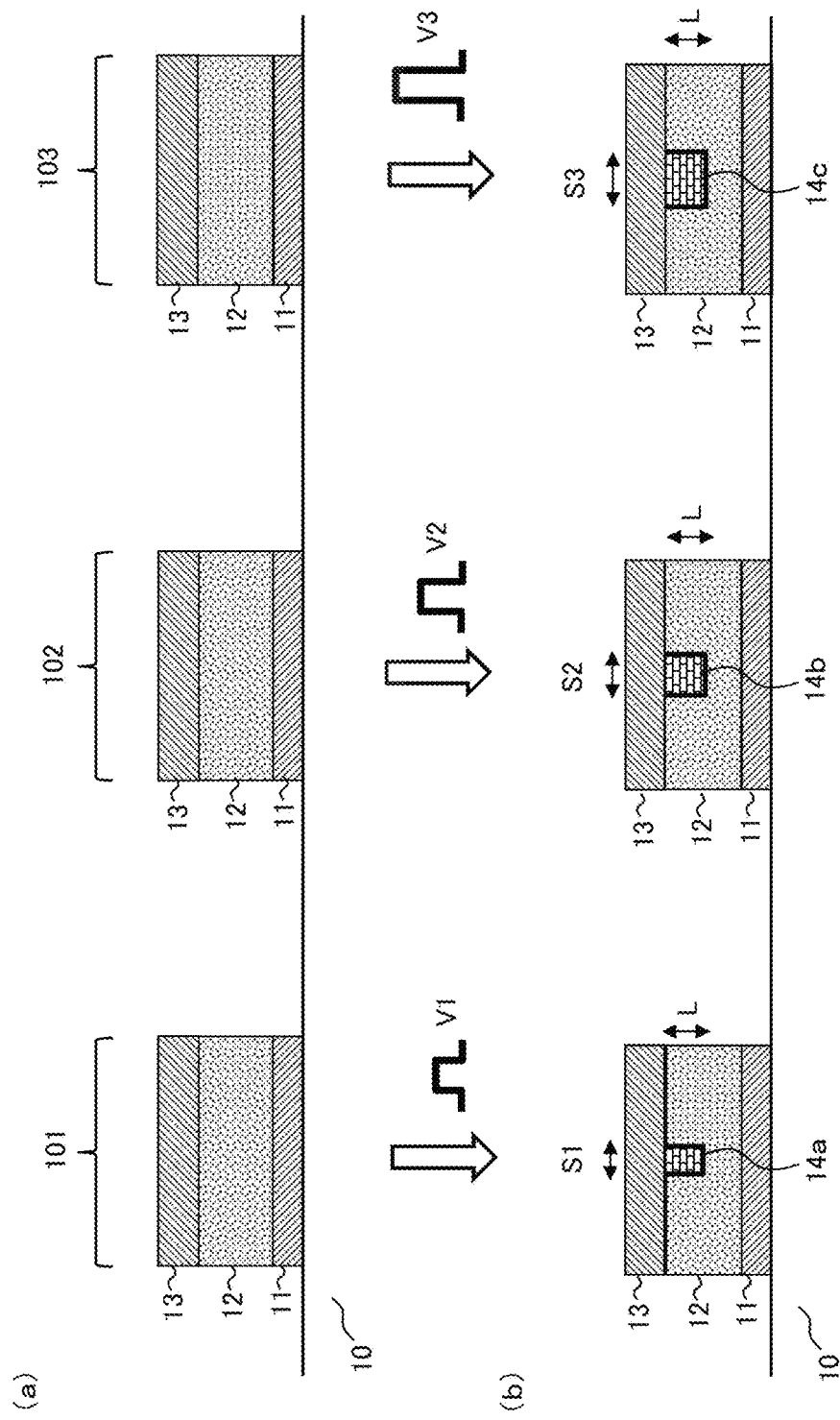

FIG. 10C

| Weight W (= 1/R) | Filament shape | Electric pulse |
|---|---|---|
| Ws (= 1/Rs) | Ss | Vs |
| ⋮ | ⋮ | ⋮ |
| W1 (= 1/R1) | S1 | V1 |
| ⋮ | ⋮ | ⋮ |
| W2 (= 1/R2) | S2 | V2 |
| ⋮ | ⋮ | ⋮ |
| W3 (= 1/R3) | S3 | V3 |
| ⋮ | ⋮ | ⋮ |
| We (= 1/Re) | Se | Ve |

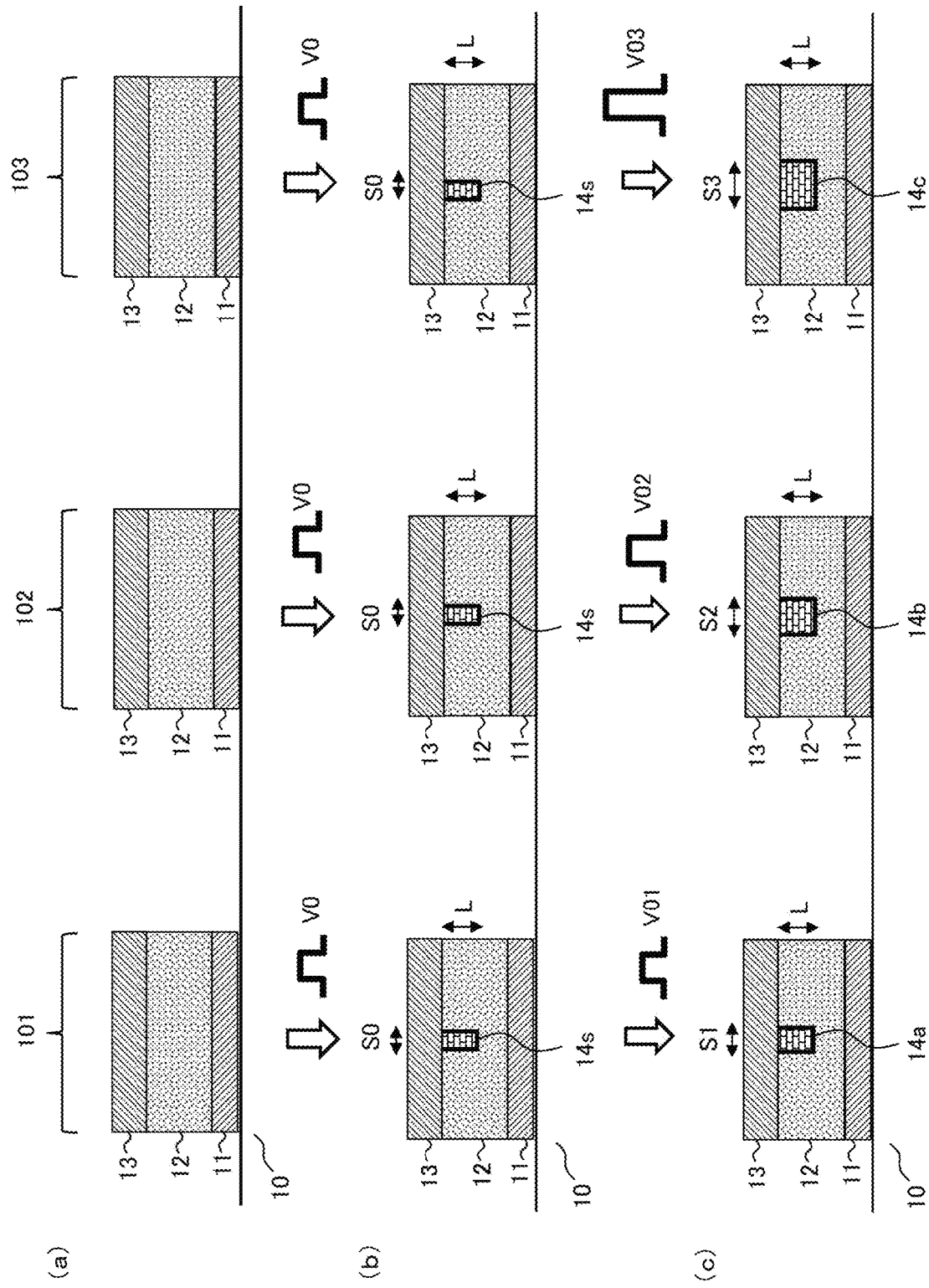

SEMICONDUCTOR DEVICE AND METHOD OF DRIVING THE SAME

CROSS REFERENCE TO RELATED APPLICATIONS

This is a continuation application of PCT International Application No. PCT/JP2021/002106 filed on Jan. 21, 2021, designating the United States of America, which is based on and claims priority of Japanese Patent Application No. 2020-010097 filed on Jan. 24, 2020. The entire disclosures of the above-identified applications, including the specifications, drawings and claims are incorporated herein by reference in their entirety.

FIELD

The present disclosure relates to a semiconductor device and a method of driving the same.

BACKGROUND

With advancement in information communication technology, the arrival of Internet of Things (IoT) technology by which all sorts of things are linked to the Internet is gathering an attention. Particularly in the era of big data where data are collected from IoT devices, there has been increasing expectations, in terms of an explosive increase in data processing on the data center side, the protection of personal data information, and real-time feedback, on edge artificial intelligence (AI) for providing, with intelligence, information processing performed by edge devices, that is, user interfaces.

What achieve such edge AI are memory computing technology utilizing resistive random access memories (ReRAMs) that are variable resistance memories, as well as the application of a neural network configuration to neuromorphic devices that schematically reproduce the operation of brain neurons.

Non-Patent Literature (NPL) 1 discloses an example of a neural network computation circuit that uses variable resistance nonvolatile memories. The neural network computation circuit is configured using variable resistance nonvolatile memories for which analog resistance values can be set, and stores analog resistance values equivalent to coupling weighting factors into nonvolatile memory elements.

CITATION LIST

Non-Patent Literature

NPL 1: M. Prezioso, et al, "Training and operation of an integrated neuromorphic network based on metal-oxide memristors", Nature, no. 521 (2015), pp, 61-64

SUMMARY

Technical Problem

Unfortunately, a problem is that variable resistance elements each of which stores, as a resistance value, a weight that takes an analog value reduce the reliability of a semiconductor device due to "variance" in the analog resistance values of the variable resistance elements.

In view of this, the present disclosure addresses the above problem and provides: a semiconductor device that is highly reliable and can reduce variance in the resistance values of variable resistance elements that store weights; and a method of driving the semiconductor device.

Solution to Problem

In order to solve the above problem, a semiconductor device according to an aspect of the present disclosure includes variable resistance elements on a semiconductor substrate. Each of the variable resistance elements includes a first electrode, a second electrode, and a variable resistance layer that is sandwiched between the first electrode and the second electrode and that stores a resistance value that is continuously variable. The variable resistance layer includes a filament whose shape differs according to a neural network weight, and stores, as an analog value, the resistance value that is variable.

A semiconductor device driving method according to an aspect of the present disclosure is a method of driving a semiconductor device that includes variable resistance elements on a semiconductor substrate. Each of the variable resistance elements includes a first electrode, a second electrode, and a variable resistance layer that is sandwiched between the first electrode and the second electrode and that stores a resistance value that is continuously variable. The semiconductor driving method includes: determining a stress of an electric pulse associated with a neural network weight; and in a forming process of forming a filament in the variable resistance layer, forming the filament whose shape differs according to the neural network weight by applying, as the stress, the electric pulse determined.

Advantageous Effects

According to an aspect of the present disclosure, an advantageous effect of reducing variance in resistance values possibly taken by variable resistance elements and thus enhancing the reliability of a semiconductor device is produced.

Note that additional benefits and advantages according to exemplary embodiments of the present disclosure will become apparent from the specification and drawings. The benefits and/or advantages may be individually obtained by various embodiments and features of the specification and drawings, and not all of which need to be provided in order to obtain one or more of such benefits and/or advantages.

BRIEF DESCRIPTION OF DRAWINGS

These and other advantages and features will become apparent from the following description thereof taken in conjunction with the accompanying Drawings, by way of non-limiting examples of embodiments disclosed herein.

FIG. 2 is a cross sectional diagram illustrating a cross section of a variable resistance element whose resistance value varies due to oxidation and reduction caused by oxygen transfer.

FIG. 10A is a cross sectional view illustrating an example of a first driving method of the semiconductor device according to the first configuration example.

FIG. 10C is a diagram illustrating an example of a reference table in which neural network weights are associated with electric pulses.

FIG. 13A is a cross sectional view illustrating an example of a second driving method of the semiconductor device according to the first configuration example.

Figure 1A:
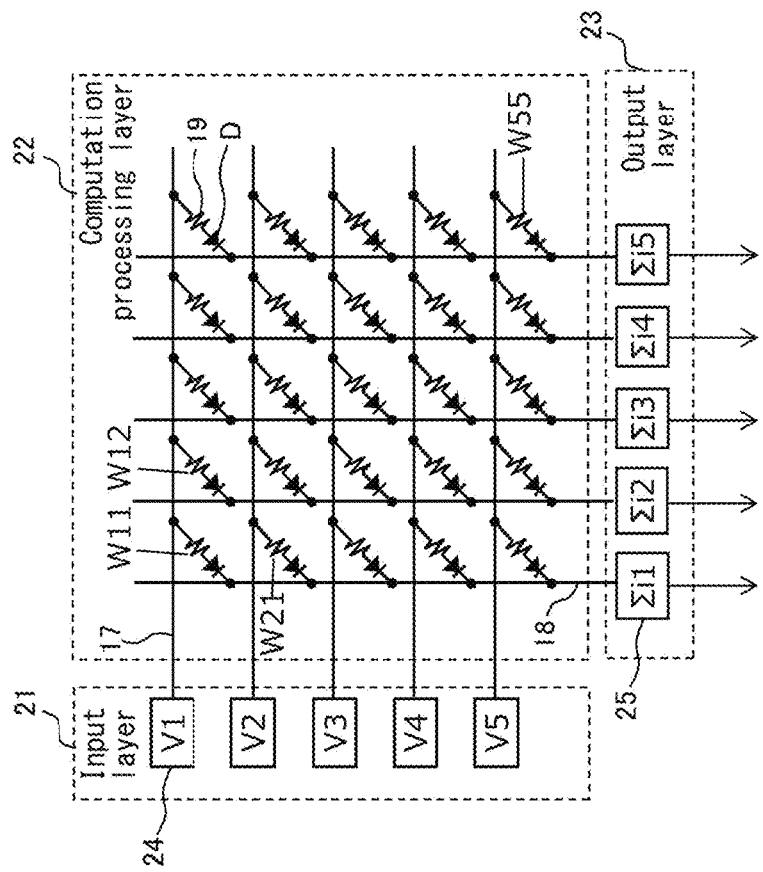
FIG. 1A is a diagram illustrating a configuration example of a semiconductor device that performs memory computing utilizing variable resistance elements according to an embodiment.

DESCRIPTION OF EMBODIMENTS (Knowledge Forming the Basis of the Present Disclosure)

Regarding a semiconductor device which includes a neural network computation circuit that uses variable resistance nonvolatile memories and that is mentioned in the section of "Background", the inventors have found that the following problems occur.

The "Background" section discloses a neural network which uses variable resistance elements each of which stores, as a resistance value, a weight that takes an analog value.

However, the following problems still remain to be solved: how to control a resistance value having a continuous value that is held as a weight, how to reduce variance in resistance values in particular, reliability in the holding of weights in consideration of the long-term use of the weights, etc.

Since a variable resistance element as a digital memory stores a binary value indicating high resistance and low resistance, if the worst bit exceeds a preset threshold due to variance among variable resistance elements, the variable resistance element becomes defective. Accordingly, "error rate" with respect to the threshold determines the performance of the element.

In a variable resistance element that stores an analog weight, on the other hand, a resistance value is used directly for neural network computing. In this case, it is assumed that not the "error rate" but "variance" itself in resistance values for one weighted value causes an issue of reliability of the resistance values and even an issue of reliability of memory computing performed by a semiconductor device. In other words, if the "variance" is large, not only the reliability of the resistance values but also the reliability of a neural network is degraded.

In view of this, the present disclosure addresses the above problems and provides: a semiconductor device that is highly reliable and can reduce variance in the resistance values of variable resistance elements that store weights; and a method of driving the semiconductor device.

In order to solve the above problems, a semiconductor device according to an aspect of the present disclosure includes variable resistance elements on a semiconductor substrate. Each of the variable resistance elements includes a first electrode, a second electrode, and a variable resistance layer that is sandwiched between the first electrode and the second electrode and that stores a resistance value that is continuously variable. The variable resistance layer includes a filament whose shape differs according to a neural network weight, and stores, as an analog value, the resistance value that is variable.

By thus associating a neural network weight with the shape of a filament, it is possible to reduce variance in resistance values possibly taken by variable resistance elements in accordance with the value of one weight, improve the data retention characteristics of the variable resistance elements, and enhance the reliability of a semiconductor device.

The area of the filament in a plan view of the semiconductor substrate may differ according to the neural network weight.

In addition to the above-described effect, this makes it easier to control the area of a filament, as the shape of the filament, in a variable resistance layer by the application of an electric pulse.

The length of the filament in a direction in which the first electrode and the second electrode face each other may differ according to the neural network weight.

In addition to the above-described effects, this enables forming a variable resistance element that is more suitable for miniaturization since the weight is associated with the length of a filament as the shape of the filament without depending on the area of the variable resistance element.

The variable resistance layer may include a first resistance layer and a second resistance layer that has a resistance value higher than a resistance value of the first resistance layer and includes the filament.

This makes it easier to set various analog resistance values by associating the area of a filament with a neural network weight where the length of the filament is approximately defined as L in a forming process.

The first electrode may be formed on the semiconductor substrate, and the variable resistance layer may have a resistance value that continuously or stepwise increases from the second electrode toward the first electrode. For example, a resistance value, per unit volume, of the variable resistance layer may continuously or stepwise increase from the second electrode toward the first electrode.

This makes it easier to set various analog resistance values by associating length L of a filament and a neural network weight where the area of the filament is approximately defined as S in the forming process.

The resistance value of the variable resistance layer may vary due to increase or decrease of oxygen defects with displacement or transfer of oxygen caused by application of an electric pulse.

In addition to the above-described effects, by controlling the stress application amount of an electric pulse, it is possible to set a resistance value that is in accordance with a desired weight, thereby more accurately performing neural network computing.

The variable resistance layer may include a transitional metal oxide.

The transitional metal oxide is, for example, a tantalum oxide or a hafnium oxide. Oxygen in the transitional metal oxide is transferred due to oxidation and reduction reactions, and oxygen defect density in a filament changes. Thus, it is possible to design a desired resistance value that is in accordance with a weight.

The filament may have a current path through which a current flows via oxygen defects, and have redundant current paths that connect an end of the filament on a side of the first electrode to an end of the filament on a side of the second electrode.

Accordingly, it is possible to reduce the risk of blocking a current path caused by the diffusion of oxygen which is one of the causes of degradation in the data retention characteristics of a variable resistance element. This makes it possible to provide a highly reliable semiconductor device.

The oxygen defect density of the filament may not depend on the neural network weight.

Accordingly, if a constant value that allows redundant current paths and does not depend on a weight is set for oxygen defect density, it is possible to more easily reduce variance in the resistance values of variable resistance elements.

The resistance value of the variable resistance layer may vary due to metal ion transfer caused by application of an electric pulse.

In addition to the above-described effects, by controlling the stress application amount of an electric pulse, it is possible to set a resistance value that is in accordance with a desired weight, thereby more accurately performing neural network computing.

Each of resistance values of at least half the variable resistance elements may be larger than a median value of the analog values assumable by resistance values of the variable resistance elements.

Accordingly, by controlling a product sum current flowing through an output layer, it is possible to provide a semiconductor device which is suitable for low power consumption and has excellent low power consumption.

Each of resistance values of at least half the variable resistance elements may be smaller than a median value of the analog values assumable by resistance values of the variable resistance elements.

Accordingly, by using weights with small resistance values and relatively less variance to reduce variance in product-sum currents flowing through output layers, it is possible to provide a semiconductor device which has excellent final application accuracy.

A semiconductor device driving method according to an aspect of the present disclosure is a method of driving a semiconductor device that includes variable resistance elements on a semiconductor substrate. Each of the variable resistance elements includes a first electrode, a second electrode, and a variable resistance layer that is sandwiched between the first electrode and the second electrode and that stores a resistance value that is continuously variable. The semiconductor driving method includes: determining a stress of an electric pulse associated with a neural network weight; and in a forming process of forming a filament in the variable resistance layer, forming a filament whose shape differs according to the neural network weight by applying, as the stress, the electric puke determined.

Accordingly, it is possible to provide a semiconductor device capable of reducing variance in resistance values possibly taken by variable resistance elements in accordance with weights, and improving the data retention characteristics of the variable resistance elements.

At least one of a voltage value, a current value, or an application time of the electric puke may differ according to the neural network weight.

Accordingly, by transferring oxygen ions or metal ions by an electric puke, it is possible to set a desired resistance value that is in accordance with a weight.

The stress of the electric pulse may include a first electric puke that is common to the variable resistance elements and a second electric puke that is not common to the variable resistance elements and is associated with the neural network weight. In the forming process, the first electric pulse may be applied to the variable resistance layer and the second electric puke may be further applied to the variable resistance layer.

Accordingly, it is possible to set or correct a weight by a client after the shipment of a chip, thereby updating the weight to a network weight for various applications.

At least one of a voltage value, a current value, or an application time of the second electric puke may differ according to the neural network weight.

Accordingly, by transferring oxygen ions or metal ions by the second electric puke, it is possible to set a desired resistance value that is in accordance with a weight.

Embodiment

[1. Overall Configuration of Semiconductor Device]

FIG. 1A is a diagram illustrating an example of an overall configuration of a semiconductor device that performs in-memory computing by utilizing variable resistance elements according to an embodiment. The diagram illustrates an example of a neural network circuit that uses variable resistance elements each of which stores a neural network weight as a resistance value that possibly takes an analog value. Each of the variable resistance elements here is a memory element that stores an analog value, not a digital value. The semiconductor device illustrated in the diagram includes input layer 21, computation processing layer 22, and output layer 23. Note that an analog value is referred to as a physical amount whose value continuously varies and for which any value can be set within a desired range.

The configuration of the neural network including input layer 21, computation processing layer 22, and output layer 23 has an extremely high affinity with the configuration of a memory array of ReRAMs that are variable resistance memories. In the semiconductor device, a neural network computation circuit is configured using variable resistance elements for which analog resistance values can be set.

Input layer 21 has input nodes 24. In the example illustrated in the diagram, voltages V1 to V5 are input to five input nodes 24. Each of input nodes 24 is connected to a different one of word lines 17 serving as the input lines of computation processing layer 22.

Output layer 23 has output nodes 25. Each of output nodes 25 is connected to a different one of bit lines 18 serving as the output lines of computation processing layer 22.

Computation processing layer 22 is configured, for example, as one or more hidden layers, and includes word lines 17, bit lines 18, and variable resistance elements 19 formed at intersections of word lines 17 and bit lines 18. Word lines 17 and bit lines 18 are arranged in a grid. In other words, variable resistance element 19 is disposed at each of the intersections of the grid. Backflow prevention diode D is connected in series to each variable resistance element 19. Although a diode is used as the selection element of variable resistance element 19 in such a cross-point structure, the diode may be electrically replaced with a transistor which is a three-terminal element generally used.

Figure 1B:
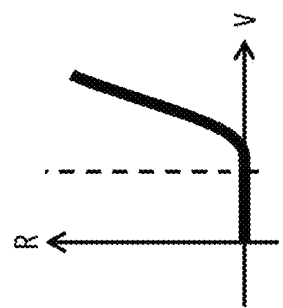
FIG. 1B is a diagram illustrating the resistance value-voltage characteristics of a variable resistance element.

Variable resistance element 19 has a resistance value that is continuously variable in accordance with neural network weight W. FIG. 1B shows the resistance-voltage characteristics of variable resistance element 19 that can store neural network weight W as the inverse number of resistance value R that is continuous.

When voltages V1 to V5 are applied, as data, to five input nodes 24 in input layer 21, a current (i=V/R=W×V) flows through the corresponding variable resistance element 19 based on Ohm's law. For example, a current derived by i=V1/R1=W11×V1 flows through variable resistance element 19 with weight W11. The value of a current from variable resistance element 19 connected to a corresponding one of bit lines 18 is added via bit line 18. Five output nodes 25 each output the result of product-sum operation (Σi1 to Σi5). Hierarchizing variable resistance elements 19 or increasing the capacity of variable resistance element 19 enables large-scaled computation to a satisfactory extent.

As described above, by executing the product-sum operations of plural items of data at the same time, it is possible to achieve collecting an overwhelming amount of information and drastically reduce the scale of a circuit, thereby achieving ultra-low consumption and ultra-compact edge AI.

Note that output node 25 may output a current value, as-is, as the result of a product-sum operation or convert a current value into a voltage value to output the resulting value.

FIG. 2 is a cross sectional view illustrating a cross section of variable resistance element 19 whose resistance value varies due to oxidization and reduction caused by oxygen transfer. In the diagram, (a) shows a low resistance state (LRS) and (b) shows a high resistance state (HRS). Variable resistance element 19 includes first electrode 11, second electrode 13, and variable resistance layer 12 sandwiched between first electrode 11 and second electrode 13. Part of variable resistance layer 12 changes (e.g., an electrical breakdown) by electrical processing called forming, and filament 14 through which a current mainly flows is formed. Multiple oxygen defects 15 and multiple oxygen ions 16 generated through the forming are present in filament 14. The principle is that oxygen ions 16 are transferred by a voltage applied between first electrode 11 and second electrode 13, the resistance value of variable resistance element 19 varies due to an increase or a decrease in the density of oxygen defects 15 in filament 14, and a current flows by hopping conduction via oxygen defects 15.

As illustrated in (a) in FIG. 2, when a positive voltage is applied to first electrode 11 and a negative voltage is applied to second electrode 13, oxygen ions 16 that are negatively charged are attracted to first electrode 11, and some of oxygen ions 16 captured by oxygen defects 15 are released from oxygen defects 15 and then move to a region outside filament 14 in variable resistance layer 12, With this, the density of oxygen defects 15 in filament 14 increases and the current easily flows. In other words, variable resistance element 19 is in the LRS (low resistance state).

As illustrated in (b) in FIG. 2, on the other hand, when a negative voltage is applied to first electrode 11 and a positive voltage is applied to second electrode 13, oxygen ions 16 that are positively charged are attracted to second electrode 13 and enter filament 14, and some of oxygen ions 16 are captured by oxygen defects 15. The density of oxygen defects 15 in filament 14 decreases and the paths (i.e., current paths) of filament 14 are blocked. This heightens the insulation properties of variable resistance layer 12 and the current does not flow much. In other words, variable resistance element 19 is in the HRS (high resistance state).

Thus, by adjusting electrical energy to be added such as the magnitude of the voltage of an electrical stress to be applied, the application time of the electrical stress, and the magnitude of a current that flows during the application of the electrical stress, the transfer amount of oxygen ions 16 can be controlled in variable resistance element 19 whose value varies due to oxidization and reduction caused by oxygen transfer. In other words, it is possible to set a desired resistance value and store a neural network weight as an analog value.

Note that the resistance of each of regions on opposite sides of filament 14 in variable resistance layer 12 may be higher than that of filament 14. This is because a current flows with filament 14 in the center. It is assumed that the resistance of a region below filament 14 in variable resistance layer 12 is set so that a current basically flows through the region as in filament 14.

Figure 3:
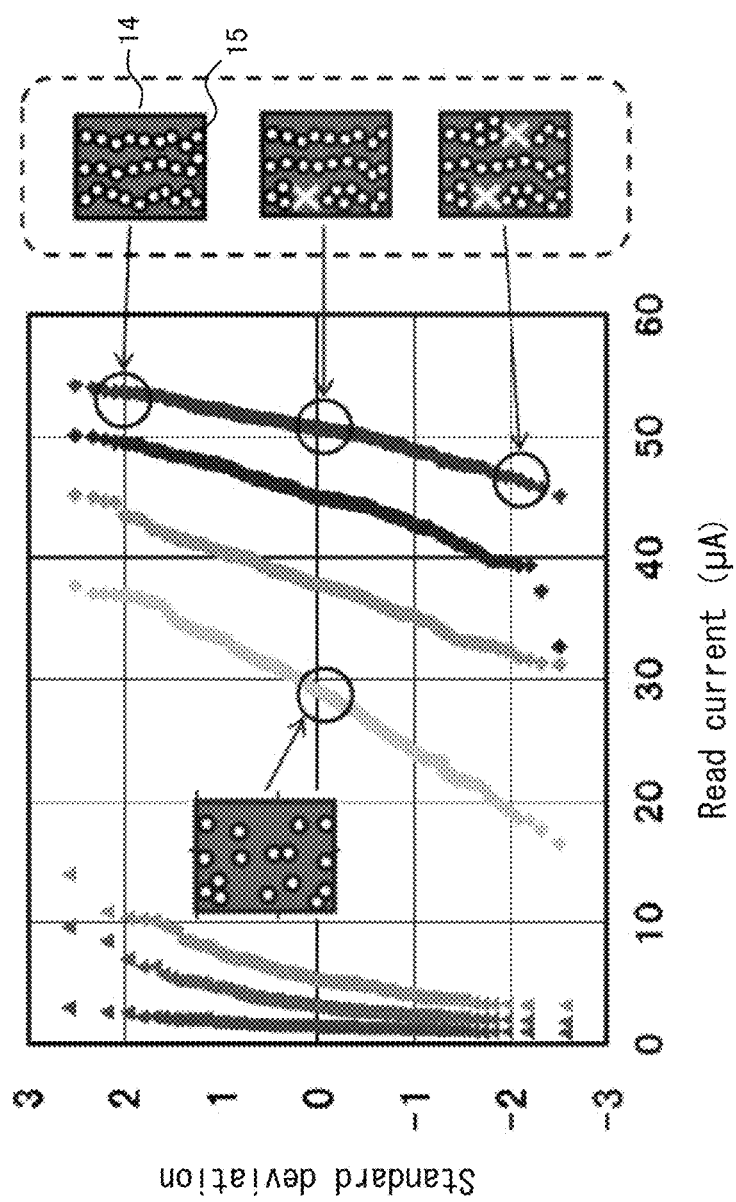
FIG. 3 is a diagram illustrating a distribution of read currents each obtained by reading, as a current, the analog resistance value of a variable resistance element in the semiconductor device.

FIG. 3 is a diagram illustrating a distribution of read currents obtained by reading, as a current, the analog resistance value of variable resistance element 19 in the semiconductor device. The horizontal axis indicates the read current of the analog resistance value that is associated with a neural network weight and is possibly taken by variable resistance element 19, for all of regions including a region in a high resistance state and a region in a low resistance state. The vertical axis indicates a standard deviation indicating a distribution of the read currents.

In the case of using variable resistance element 19 as a digital memory that stores a binary value including 0 and 1, a high resistance state that is leftmost and a low resistance state that is rightmost are used, and a memory window that is the difference between the two states can be satisfactorily maintained.

In the case of assigning a neural network weight to the analog resistance value of variable resistance element 19 to use variable resistance element 19 for memory computing, the resistance values of all of regions, which variable resistance element 19 possibly takes, are used basically. As can be seen from FIG. 3, it is observed that variance in read currents is larger in an intermediate region than in a region that is in a low resistance state or in a region that is in a high resistance state. This suggests that the density of oxygen defects 15 in filament 14 is high and robust filament paths, i.e., current paths, are formed in the rightmost low resistance state, whereas the density of oxygen defects 15 is low and the characteristics of the filament paths change (a path is blocked in one or more parts) in the intermediate region. These features depend very much on the characteristics of filament 14 that are to be described below and are deeply related to the data retention characteristics of variable resistance element 19.

Figure 4:
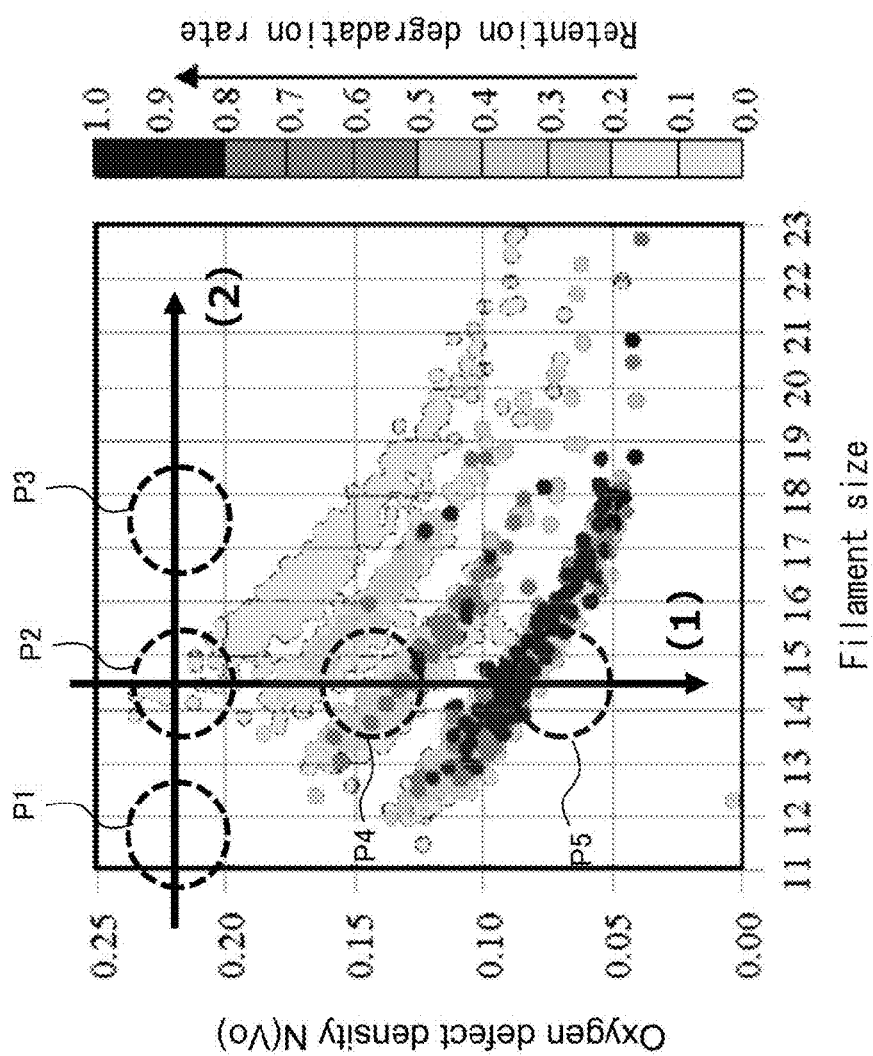
FIG. 4 is a correlation diagram illustrating the relationship between filament characteristics and data retention characteristics of a variable resistance element.

FIG. 4 is a correlation diagram illustrating the relationship between filament characteristics and data retention characteristics of variable resistance element 19. A quantitative modeling is established for the filament characteristics, using parameters such as area S of filament 14 and density N(Vo) of oxygen defects 15 in filament 14, and a deep correlation between the filament characteristics and the data retention characteristics is found.

In view of this, the inventors have studied the filament characteristics of variable resistance element 19 which are suitable for an analog resistance value from the result of an experiment conducted to observe the relationship between data retention characteristics and filament characteristics of variable resistance element 19 composing a memory referred to as ReRAM. FIG. 4 is a correlation diagram indicating the relationship between filament characteristics and data retention characteristics of variable resistance element 19. FIG. 4 illustrates the correlation between the area of a filament and the density of oxygen defects, as the degradation rate of the data retention characteristics at 85 degrees Celsius after rewriting of ten thousand times for approximately ten years. The diagram shows that the data retention characteristics improve as the gradation of dots gets thinner. The attention here is drawn to a low resistance state in which the degradation of the data retention characteristics is apt to occur. The degradation of the data retention characteristics is attributed to the fact that oxygen ions are diffused by heat during data retention and captured by oxygen defects, and this blocks some of filament paths, decreases the amount of a read current, and reduces the size of a memory window. This phenomenon is not a problem in a high resistance state. The result of the experiment shows that density N(Vo) of oxygen defects in a filament has to be set basically high in order to inhibit the degradation of data retention characteristics and miniaturize variable resistance element 19, i.e., miniaturize a filament. In other words, it is important to increase oxygen defect density N(Vo) to form an aggregation of multiple filament paths like a net and form filament paths that are robust even if some of the diffused oxygen ions are captured by some of oxygen defects V0.

In the case of using a filament completed for such a memory application, as-is, for memory computing, on the other hand, a drive power is adjusted and a neural network weight is set to be equivalent to an analog resistance value so that oxygen defect density in the filament is decreased. In FIG. 4, filament characteristics change in the direction of (1). While values with larger weights with which high oxygen defect density can be maintained exhibit good data retention characteristics, oxygen defects with bad data retention characteristics are used for smaller weights with low oxygen defect density. This causes variance in read currents in FIG. 3, which is larger in the vicinity of the center of the resistance values possibly taken by variable resistance element 19.

In view of this, the inventors adjust a resistance value based mainly on the shape of a filament such as the area or length of a filament, but not on oxygen defect density, provide a filament with excellent data retention characteristics (in the direction of (2) in FIG. 4), and thus provide a semiconductor device and a method of driving the semiconductor device according to the present disclosure.

[1.1 First Configuration Example of Semiconductor Device]

Figure 5:
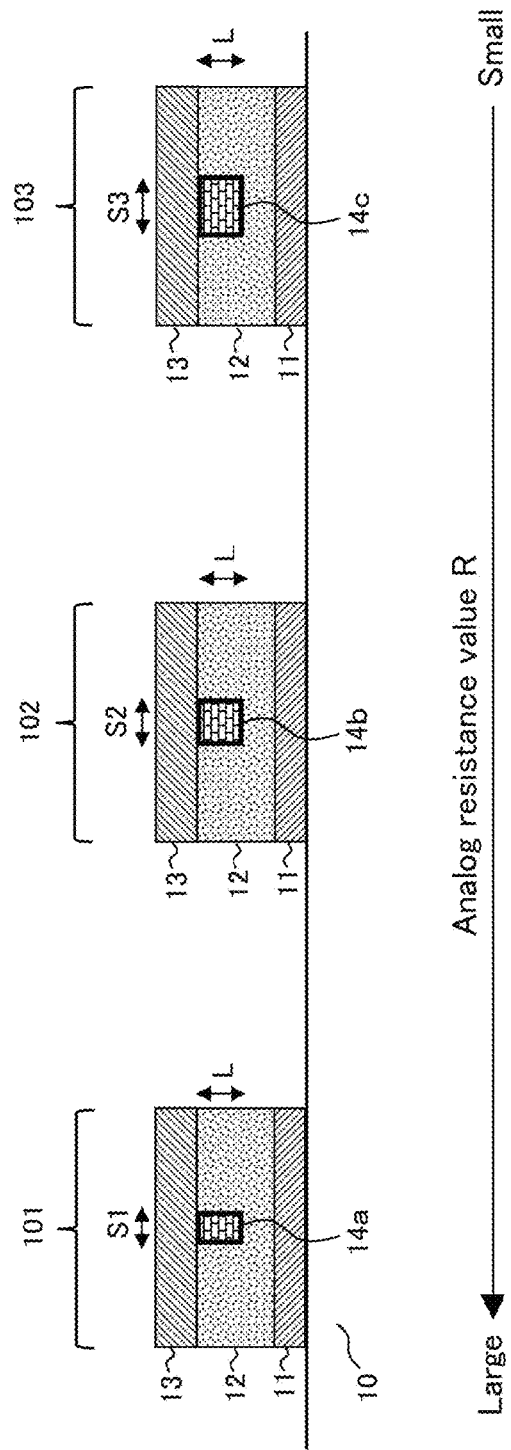
FIG. 5 is a cross sectional view illustrating a first configuration example of a semiconductor device according to the embodiment.

FIG. 5 is a cross sectional view illustrating a first configuration example of the semiconductor device according to the embodiment. Hereinafter, the semiconductor device according to the first configuration example will be described with reference to FIG. 5.

Although the semiconductor device includes multiple variable resistance elements 19 arranged in a matrix as illustrated in FIG. 1A. FIG. 5 illustrates, for the simplification of the figure, only three variable resistance elements 19 as representative examples. Three variable resistance elements 19 are referred to as first variable resistance element 101, second variable resistance element 102, and third variable resistance element 103. Moreover, wires to be connected to the electrodes of variable resistance elements 19 for obtaining the electrical signals of variable resistance elements 19, as well as a transistor for a circuit that provides electrical signals to be applied to variable resistance elements 19 are also present in the semiconductor device, but are omitted because they are not directly related to the present disclosure. The same applies to the diagrams to be described below.

In the example illustrated in FIG. 5, the semiconductor device according to the first configuration example includes variable resistance elements 19 formed on semiconductor substrate 10. The diagram illustrates, as representative examples, first variable resistance element 101, second variable resistance element 102, and third variable resistance element 103 as variable resistance elements 19. Each of first variable resistance element 101, second variable resistance element 102, and third variable resistance element 103 has first electrode 11, variable resistance layer 12, and second electrode 13. Variable resistance layer 12 is sandwiched between first electrode 11 and second electrode 13 and stores a resistance value that is continuously variable.

In each of variable resistance layers 12, part of variable resistance layer 12 changes (e.g., electrical breakdown) by electrical processing called forming, and a different one of filaments 14a, 14b, and 14c, which determines the variable resistance characteristics of the corresponding variable resistance layer 12 and through which a current mainly flows, is formed. The area of filament 14a in first variable resistance element 101 is S1, the area of filament 14b in second variable resistance element 102 is S2, and the area of filament 14c in third variable resistance element 102 is S3, Area S of filament 14 differs according to neural network weight W. The shape of filament 14 formed through the forming is actually not perfectly cylindrical, but can be schematically regarded as cylindrical. Area S of filament 14 may be defined, for example, as the average cross-sectional area of filament 14 sectioned by a plane parallel to semiconductor substrate 10 or as the area of the contact portion between second electrode 13 and filament 14. Areas S1, S2, and S3 in the diagram differ from one another according to neural network weights W.

The length of the filament is L in any of first variable resistance element 101, second variable resistance element 102, and third variable resistance element 103.

Accordingly, analog resistance value R of filament 14 increases as area S decreases. Since it is possible to change a current flowing through variable resistance element 19, depending on area S of filament 14, the shape of filament 14 which maintains robust network paths can be maintained without drastically changing oxygen defect density that greatly affects the data retention characteristics of variable resistance element 19, and various analog resistance values R associated with neural network weights can be set. Stated differently, by maintaining oxygen defect density to be constant or within a certain range without letting the oxygen defect density depend on neural network weight W, it is possible to set analog resistance value R which depends on area S, in a state in which multiple current paths are redundantly formed in filament 14. It is therefore possible to provide a semiconductor device for memory computing which has excellent reliability and less variance in the weights of analog resistance values R.

A nonvolatile memory element whose resistance value reversibly varies due to the application of an electric pulse can be used as variable resistance element 19 for the semiconductor device described above. A conductive bridge random access memory (CBRAM) utilizing a change in its resistance value due to metal ion transfer caused by the application of an electric pulse, or the like, may be used instead of the ReRAM described above.

First electrode 11 and second electrode 13 may be configured using, for example, a tantalum nitride with the thickness of 5 nm to 30 nm or other material such as platinum, iridium, ruthenium tungsten, nickel, tantalum, titanium, aluminum, a titanium nitride, etc. Electrode materials may be different between first electrode 11 and second electrode 13 in accordance with the applications of the electrodes.

A transitional metal oxide may be used for the metal oxide of variable resistance layer 12. In the case of using tantalum or hafnium as a transitional metal included in the transitional metal oxide, a material (e.g., a noble metal based material) exhibiting a reference electrode potential that is the same as or higher than that of tantalum or hafnium may be selected for one of the electrodes to use a material that is likely to cause a resistance change.

Alternatively, a material exhibiting a reference electrode potential that is the same as or lower than that of tantalum or hafnium may be selected for one of the electrodes to use a material that is unlikely to cause a resistance change. Specifically, at least one material selected from a group consisting of tantalum, a tantalum nitride, titanium, a titanium nitride, and a titanium-aluminum nitride can be used. With such a configuration of variable resistance layer 12, it is possible to achieve stable resistance change characteristics.

For example, variable resistance element 19 has a side with the length of approximately 100 nm, whereas area S of filament 14 can be adjusted within the range from 5 nm to 30 nm while maintaining the relationship of $S1<S2<S3$ for the sizes of areas S1, S2, and S3. Moreover, the size of filament 14 is in a relative relationship with variable resistance element 19 and can be adjusted in the range from several nm to approximately 100 nm while variable resistance element 19 has a side with a length in the range from 50 nm to 500 nm.

[1.2 Second Configuration Example of Semiconductor Device]

Figure 6:
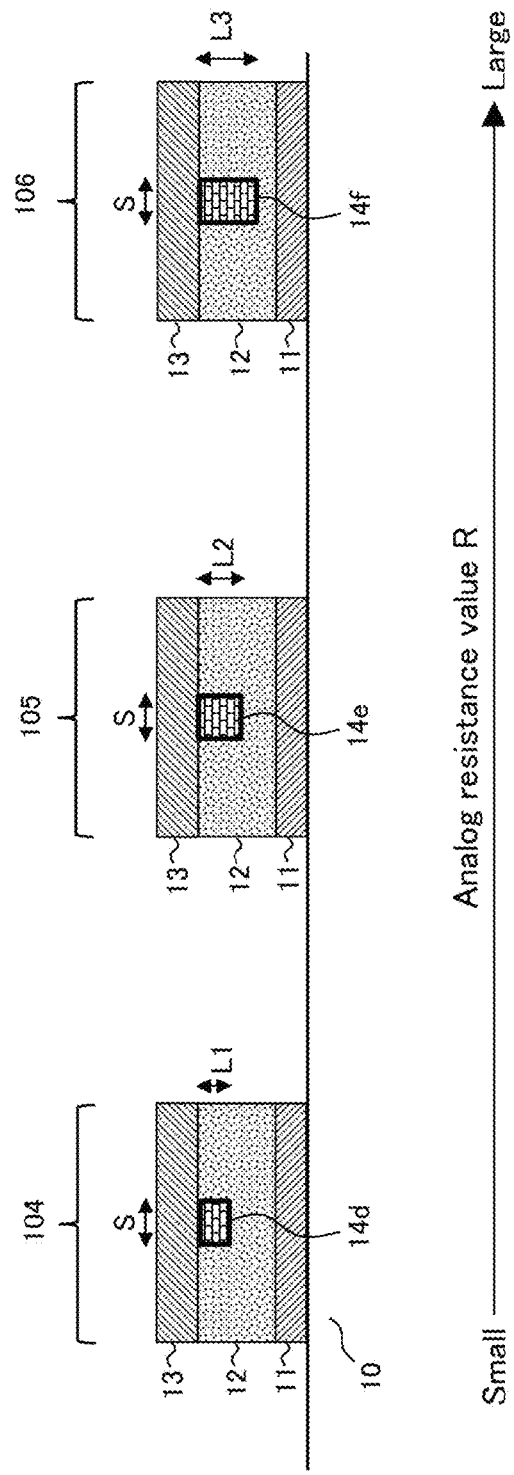
FIG. 6 is a cross sectional view illustrating a second configuration example of the semiconductor device according to the embodiment.

FIG. 6 is a cross sectional view illustrating a second configuration example of the semiconductor device according to the embodiment. Hereinafter, the semiconductor device according to the second configuration example will be described with reference to FIG. 6.

In the example illustrated in FIG. 6, the semiconductor device according to the second configuration example is different from the semiconductor device illustrated in FIG. 5 in that length L of filament 14 rather than area S is mainly associated with neural network weight W. The following describes the semiconductor device according to the second configuration example, focusing on the difference.

In the semiconductor devices illustrated in FIG. 6, fourth variable resistance element 104, fifth variable resistance element 105, and sixth variable resistance element 106 are illustrated instead of first variable resistance element 101, second variable resistance element 102, and third variable resistance element 103 in FIG. 5.

In each of variable resistance layers 12 in fourth variable resistance element 104, fifth variable resistance element 105, and sixth variable resistance element 106, part of variable resistance layer 12 changes (e.g., electrical breakdown) by electrical processing called forming, and a different one of filaments 14d, 14e, and 14f, which determines the variable resistance characteristics of the corresponding variable resistance layer 12 and through which a current mainly flows, is formed.

The length of filament 14d of fourth variable resistance element 104 is L1, the length of filament 14e of fifth variable resistance element 105 is L2, and the length of filament 14f of sixth variable resistance element 106 is L3. Lengths L1, L2, and L3 are different from one another in association with neural network weights.

The area of filament 14 formed in any of fourth variable resistance element 104, fifth variable resistance element 105, and sixth variable resistance element 106 is S. Accordingly, analog resistance value R of filament 14 increases as length L gets longer. Since it is possible to change a current flowing through the variable resistance element, depending on length L of filament 14, a filament shape which maintains robust network paths can be maintained without drastically changing oxygen defect density that greatly affects the data retention characteristics of the variable resistance element, and various analog resistance values R associated with neural network weights can be set. Stated differently, by maintaining oxygen defect density to be constant or within a certain range without letting the oxygen defect density depend on neural network weight W, it is possible to set analog resistance value R which depends on length L, in a state in which multiple current paths are redundantly formed in filament 14. It is therefore possible to provide a semiconductor device for memory computing which has excellent reliability and less variance in the weights of analog resistance values R.

For example, length L of filament 14 can be adjusted within the range from 5 nm to 20 nm while maintaining the relationship of $L1<L2<L3$ for the lengths of L1, L2, and L3, whereas variable resistance element layer 12 has the thickness of approximately 20 nm. Moreover, length L of filament 14 is in a relative relationship with the thickness of variable resistance layer 12 and can be adjusted in the range from several nm to approximately 100 nm while variable resistance layer 12 has a thickness in the range from 10 nm to 100 nm.

Note that the types of a memory that can be used for memory computing as well as the materials of first electrode 11, second electrode 13, and variable resistance layer 12 in the second configuration example may be the same as those described in the first configuration example.

[1.3 Configuration of Variable Resistance Layer 12]

Next, a more specific configuration example of variable resistance layer 12 will be described.

Figure 7A:
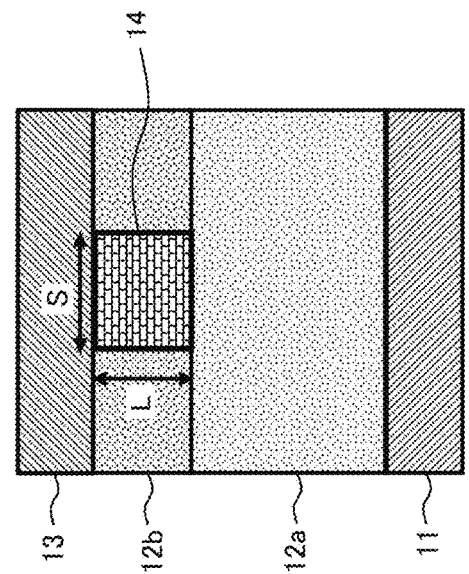
FIG. 7A is a cross sectional view illustrating an example of a variable resistance layer in the semiconductor device according to the first configuration example.
Figure 7B:
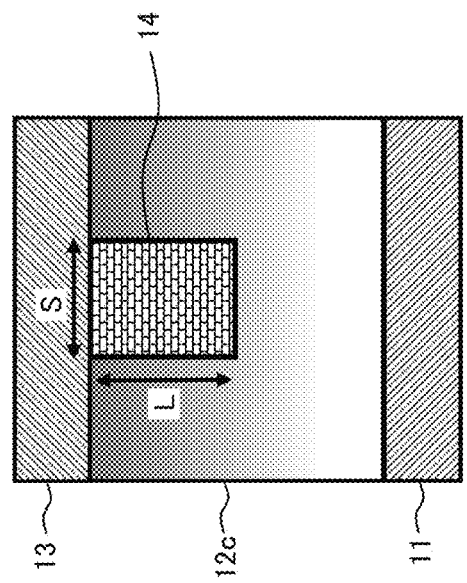
FIG. 7B is a cross sectional view illustrating another example of a variable resistance layer in the semiconductor device according to the second configuration example.

FIG. 7A is a cross sectional view illustrating an example of variable resistance layer 12 of the semiconductor device according to the first configuration example. FIG. 7B is a cross sectional view illustrating another example of variable resistance layer 12 of the semiconductor device according to the second configuration example. Hereinafter, the configuration examples of variable resistance layer 12 will be described with reference to the figures.

In the example illustrated in FIG. 7A, variable resistance layer 12 includes first variable resistance layer 12a having a lower resistance value and second variable resistance layer 12b having a higher resistance value. There is a clear boundary between first variable resistance layer 12a and second variable resistance layer 12b. In such a case where variable resistance layer 12 has the boundary (e.g., has two layers having different oxygen concentrations in the case where the variable resistance layer includes a transitional metal oxide), filament 14 which determines variable resistance characteristics and through which a current mainly flows is formed in second variable resistance layer 12b through electrical processing called forming. This is because an electrical stress is distributed and is applied with priority to second variable resistance layer 12b having a higher resistance value. Accordingly, the length of filament 14 is determined basically as L that is approximately the same as the height of second variable resistance layer 12b in an up-and-down direction. It is possible to adjust area S of filament 14 to, for instance, S1, S2, or S3, to set various analog resistance values associated with neural network weights. Note that the up-and-down direction is a direction in which first electrode 11 and second electrode 13 face each other, In the example illustrated in FIG. 7B, variable resistance layer 12 is configured as third variable resistance layer 12c whose resistance value continuously or stepwisely varies from second electrode 13 toward first electrode 11. Specifically, third variable resistance layer 12c has a profile of continuously or stepwisely varying the resistance value so that a region of third variable resistance layer 12c, which is close to second electrode 13, has a high resistance value such that its composition includes a transitional metal oxide with high oxygen concentration and a region of third variable resistance layer 12c, which is close to first electrode 11, has a low resistance value such that its composition includes a transitional metal oxide with low oxygen concentration.

In such a case where the resistance value of a variable resistance layer continuously varies (the variable resistance layer has a profile of continuously changing oxygen concentration in the case where the variable resistance layer includes a transitional metal oxide), a filament is formed in third variable resistance layer 12c through electrical processing called forming, and the length of the filament to be formed differs according to the magnitude of an electrical stress applied during the forming. This is because the electrical stress is distributed and the length of the filament as well as a point at which third variable resistance layer 12c is formed and a load resistance is optimal in a region below the filament change. This drastically increases the range of variance in resistance values each being determined by the length of a filament more than the range of variance in resistance values which is caused by a change in the area of a filament, Thus, the area of filament 14 is determined basically as S. It is possible to adjust length L of filament 14 to, for instance, L1, L2, or L3, to set various analog resistance values associated with neural network weights.

[1.4 Configuration of Highly Reliable Filament]

Figure 8:
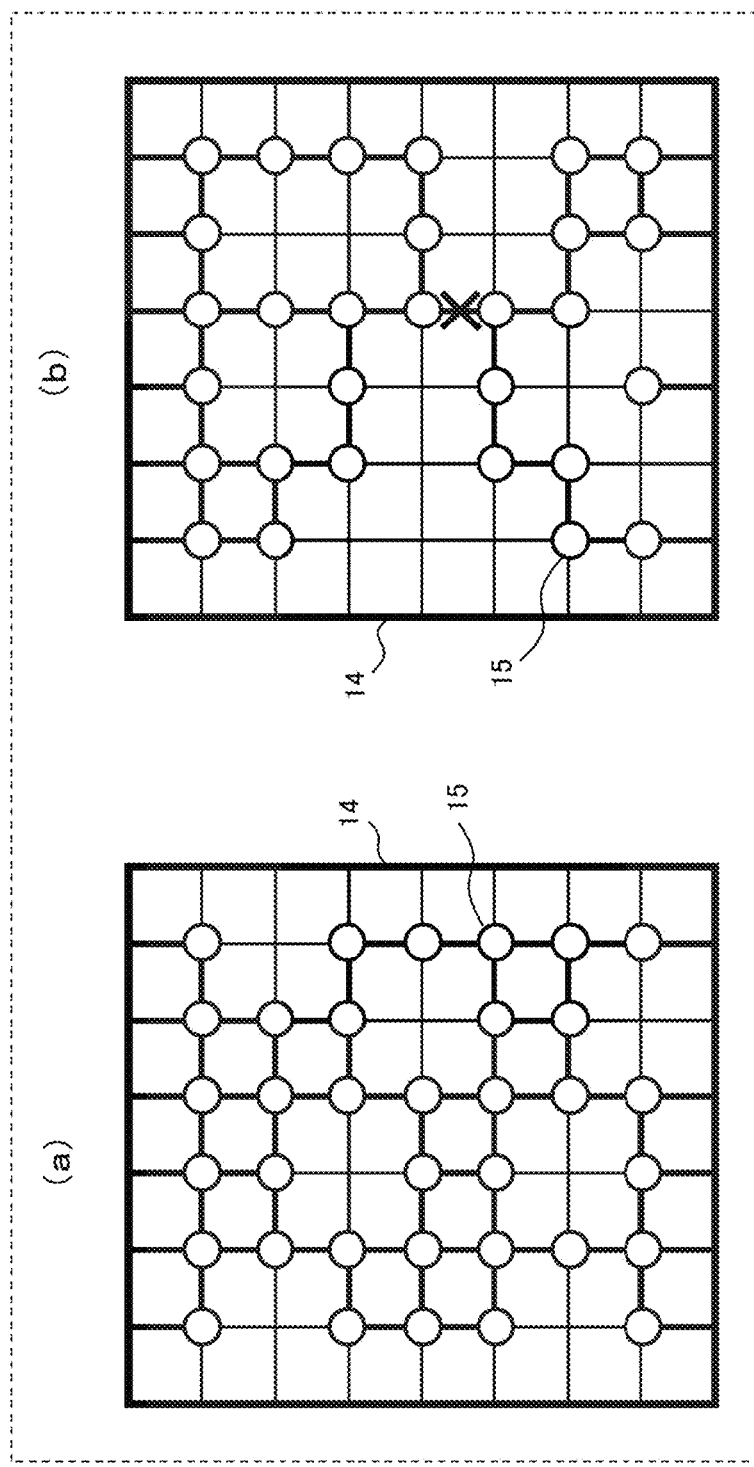
FIG. 8 is an illustration showing network paths generated by oxygen defects formed in a filament in the semiconductor device according to the embodiment.

FIG. 8 is an illustration showing network paths, i.e., current paths, generated by oxygen defects 15 formed in filament 14 of the semiconductor device according to the first or second configuration example.

Network paths through which a current flows in a direction from the upper portion to the lower portion or in the opposite direction thereof in a cross section of filament 14 in an up-and-down direction are schematically shown using oxygen defects 15. The thick lines each indicate a current path between oxygen defects that are present within a distance in which electrons can hop, that is, the electrons are located in such proximity to each other that a current flows. The thin lines each schematically indicate a current path between oxygen defects that are not in such proximity to each other that a current flows.

In (a) in FIG. 8, the network paths that are current paths formed by oxygen defects 15 include at least current paths that can be redundant in all the areas of current paths that connect the upper portion and the lower portion of filament 14. In other words, with such redundant current paths, a current can flow even if oxygen is diffused during data retention, electrons are thereby captured by oxygen defects, and a network path where the oxygen defects captured the electrons is blocked. It is thus possible to minimize a change of a resistance value.

In (b) in FIG. 8, on the other hand, a location (the mark x in the diagram) that is a bottleneck for current paths to be redundant is present in network paths in filament 14. When oxygen is diffused to oxygen defects forming a network path having such a location, a current no longer flows without any alternative current path and a resistance value varies greatly.

The semiconductor device according to the first configuration example illustrated in FIG. 5 or the semiconductor device according to the second configuration example illustrated in FIG. 6 has current paths that can be redundant throughout the entire region of filament 14 as illustrated in (a) in FIG. 8. In other words, filament 14 has current paths through which a current flows via oxygen defects, and also has redundant current paths connecting an end of first electrode 11 to an end of second electrode 13 of filament 14. Accordingly, it is possible to reduce the risk of blocking a current path due to the diffusion of oxygen which is one of the causes of degradation in data retention characteristics, and this makes it possible to provide a semiconductor device with higher reliability.

[1.5 Setting of Neural Network Weights]

Next, a setting example in which analog resistance values R of variable resistance elements 19 are associated with neural network weights W will be described.

Figure 9:
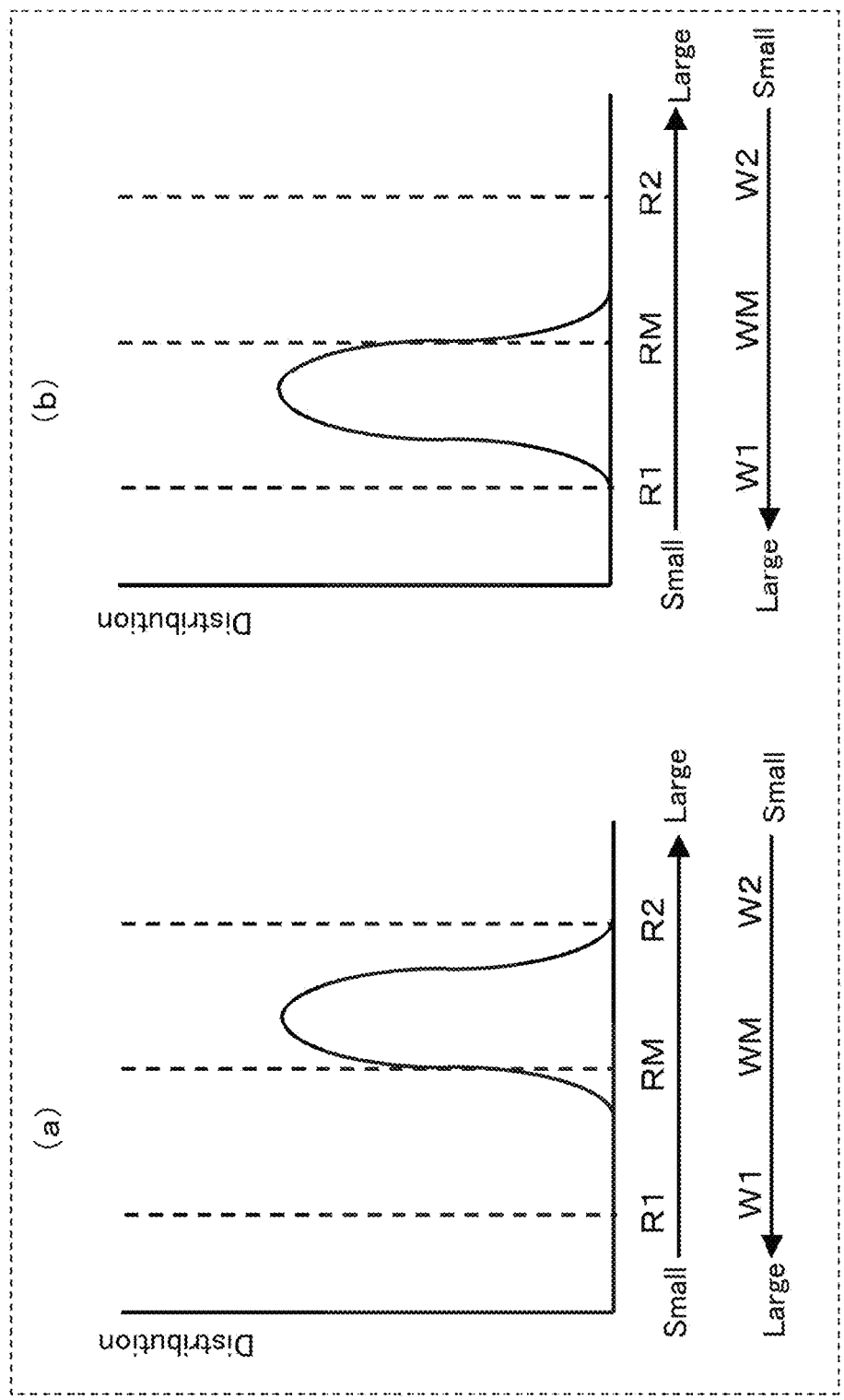
FIG. 9 is a diagram illustrating a distribution of neural network weights (analog resistance values) which are set for the semiconductor device according to the embodiment.

FIG. 9 is a diagram illustrating a distribution of neural network weights (analog resistance values) which are set for the semiconductor device according to the first or second configuration example. In the diagram, the vertical axis indicates a distribution of analog resistance values R of variable resistance elements 19, whereas the horizontal axis indicates analog resistance values R of variable resistance elements 19 as well as neural network weights W. The horizontal axis corresponds to the range from W1 to W2 (W1>W2) of neural network weight W, and analog resistance value R to be stored as the inverse number of the weight can be set in the range from R1 to R2 (R1<R2). Median value WM of the weights is equivalent to analog resistance value RM.

(a) in FIG. 9 illustrates an example in which more than half of resistance values R of variable resistance elements 19 are each set, for the semiconductor device according to the first or second configuration example, to a value larger than median value RM of analog values assumable by resistance values R. By providing training so that neural network weights W are assigned to relatively high resistance values R, it is possible to control currents that flow through output layers 23 at the time of product sum operations, and this makes it possible to provide a semiconductor device with super low power consumption.

(b) in FIG. 9 illustrates an example in which more than half of resistance values R of variable resistance elements 19 are each set, for the semiconductor device according to the first or second configuration example, to a value smaller than median value RM of analog values assumable by resistance values R. By providing training so that neural network weights W are assigned to low resistance values R with relatively less variance, it is possible to reduce variance in product-sum currents that flow through output layers 23, and this makes it possible to provide a semiconductor device with excellent final application accuracy.

[2.1 First Driving Method of Driving Semiconductor Device According to First Configuration Example]

Next, a first driving method of driving a semiconductor device according to the first configuration example will be described.

FIG. 10A is a cross sectional view illustrating an example of the first driving method of driving the semiconductor device according to the first configuration example.

In (a) in FIG. 10A, the semiconductor device according to the first configuration example includes, on semiconductor substrate 10, first variable resistance element 101, second variable resistance element 102, and third variable resistance element 103, in each of which variable resistance layer 12 is sandwiched between first electrode 11 and second electrode 13.

In (b) in FIG. 10A, in each of variable resistance layers 12, a different one of filaments 14a, 14b and 14c is formed through electrical processing called forming. An electrical stress (e.g., voltage V1) is applied to first variable resistance element 101, and filament 14a having area S1 and length L is formed. An electrical stress (e.g., voltage V2 where V2>V1) is applied to second variable resistance element 102, and filament 14b having area S2 and length L is formed. An electrical stress (e.g., voltage V3 where V3>V2) is applied to third variable resistance element 103, and filament 14c having area S3 and length L is formed. Accordingly, it is possible to change a current flowing through a variable resistance element, depending on the area of a filament. In other words, it is possible to keep a filament shape that maintains robust network paths without drastically changing oxygen defect density that greatly affects the data retention characteristics of the variable resistance element, and to set various analog resistance values associated with neural network weights. It is therefore possible to provide a semiconductor device for memory computing which has excellent reliability and less variance in the weights of analog resistance values.

Next, a specific example of the first driving method will be described.

Figure 10B:
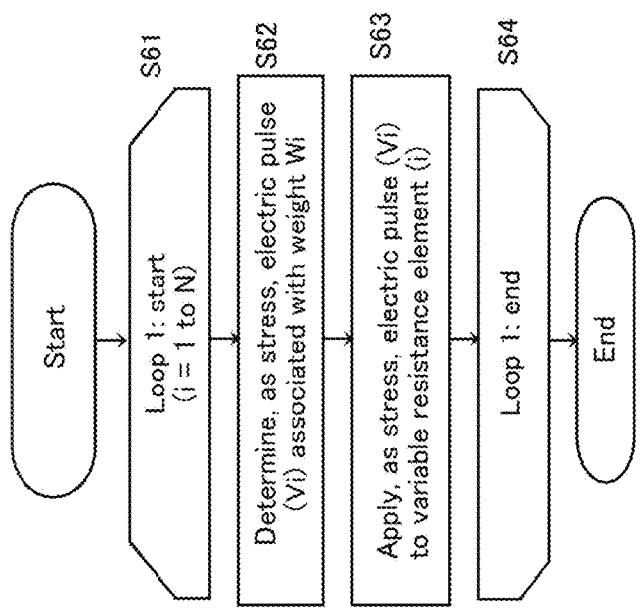
FIG. 10B is a flow chart illustrating a specific example of the first driving method illustrated in FIG. 10A.

FIG. 10B is a flow chart illustrating a specific example of the first driving method illustrated in FIG. 10A. In the diagram, N denotes the number of variable resistance elements 19. i denotes a control variable for counting from 1 to N. Wi denotes a weight corresponding to i-th variable resistance element 19. Vi denotes the stress of an electric pulse corresponding to i-th variable resistance element 19.

In loop 1 (S61 to S64), forming is sequentially performed on N variable resistance elements 19.

In loop 1, first, electric pulse Vi corresponding to weight Wi is determined as a stress (S62), Electric pulse V1 is determined, for example, by reading out a reference table illustrated in FIG. 10C. FIG. 10C is a diagram illustrating an example of a reference table in which neural network weight W, a filament shape (an area in this case), and the stress of an electrical pulse are associated with one another.

Subsequently, the determined electric pulse Vi is applied, as a stress, to i-th variable resistance element 19 (S63), According to FIG. 10B, analog resistance values R associated with weights W are thus set for N variable resistance elements 19.

Although the magnitude relationship of voltages (V1<V2<V3) is utilized for an electrical stress in FIG. 10A, a pulse width to be applied may be changed while keeping a voltage constant or a current that flows at the time of voltage application may be controlled to change electrical energy to be provided.

As an example of the above, the following describes an example of filament characteristics of variable resistance element 19 subjected to forming by way of controlling a current instead of a voltage.

Figure 11:
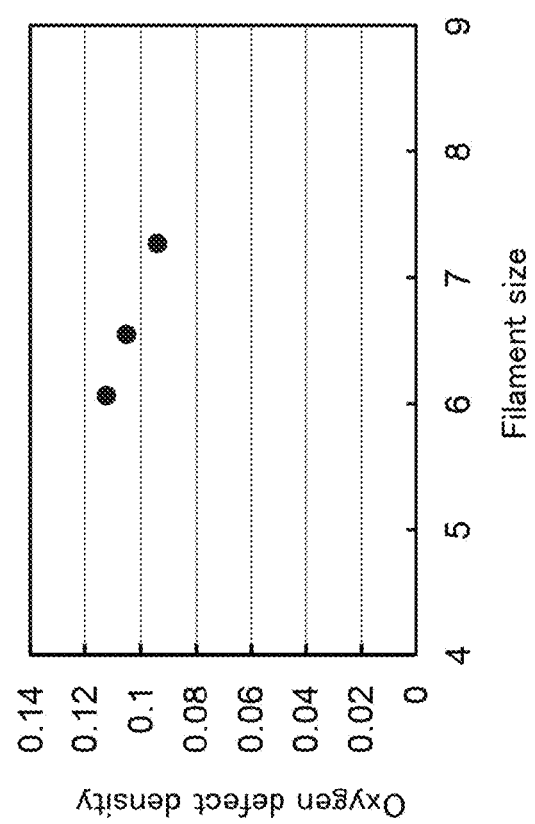
FIG. 11 is a diagram illustrating the relationship between the size of a filament and oxygen defect density in the filament in the semiconductor device according to the first configuration example.
Figure 12:
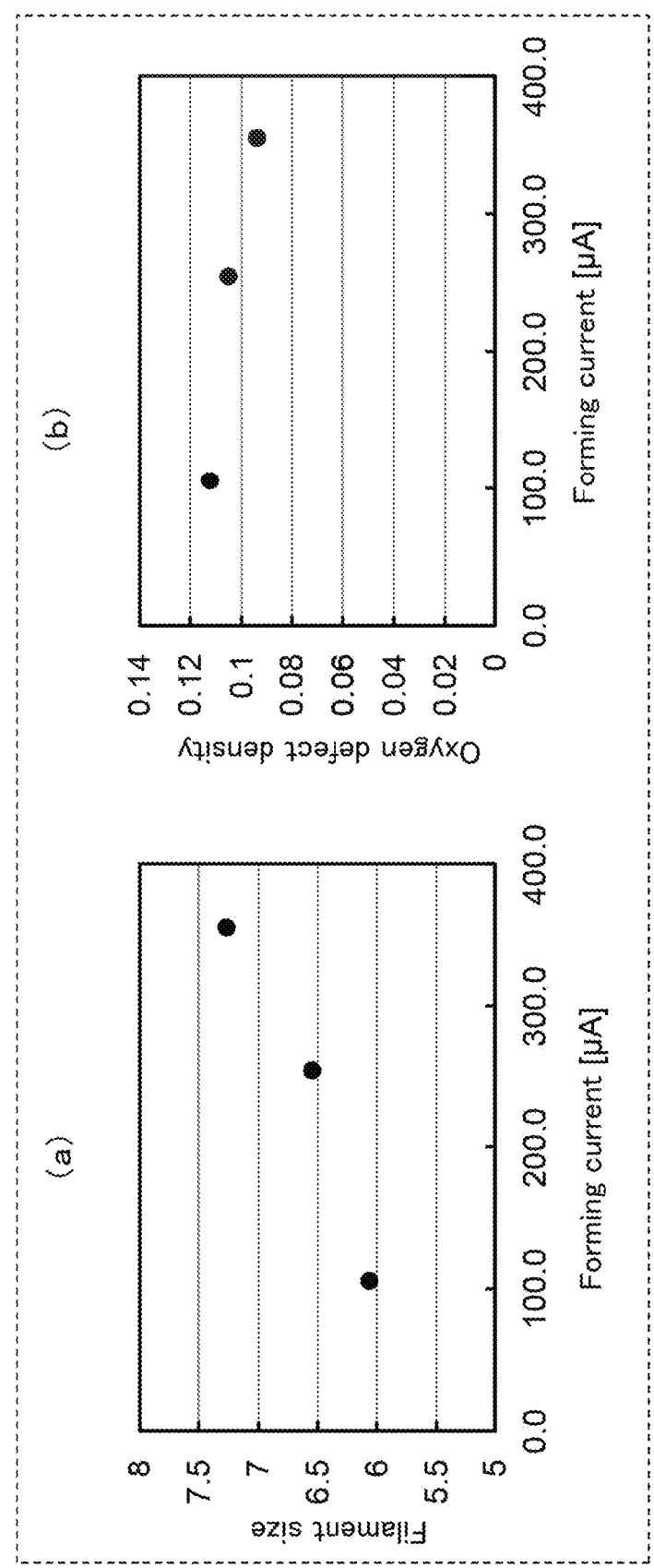
FIG. 12 is a diagram illustrating (a) a filament size for a forming current and (b) oxygen defect density for a forming current in the first driving method of the semiconductor device according to the first configuration example.

FIG. 11 is a diagram illustrating the relationship between the size of filament 14 and the density of oxygen defects 15 in filament 14 of the semiconductor device according to the first configuration example. The horizontal axis indicates the relative area of filament 14 and the vertical axis indicates the relative density of oxygen defects 15. FIG. 12 is a diagram illustrating (a) the size of filament 14 with respect to a forming current and (b) the density of oxygen defects 15 with respect to a forming current in the first driving method of the semiconductor device according to the first configuration example.

FIG. 11 shows that the filament characteristics are successfully changed mainly in a direction (direction (2) illustrated in FIG. 4) in which the area of filament 14 is changed without drastically changing the density of oxygen defects 15. (a) in FIG. 12 shows that the area of the filament monotonously increases as a forming current increases, whereas (b) in FIG. 12 shows that the oxygen defect density slightly decreases monotonously as a forming current increases. FIG. 12 thus shows that it is possible to control the density of oxygen defects by using a forming current.

[2.2 Second Driving Method of Driving Semiconductor Device According to First Configuration Example]

FIG. 13A is a cross sectional view illustrating an example of a second driving method of driving a semiconductor device according to the first configuration example.

In (a) in FIG. 13A, the semiconductor device according to the first configuration example includes, on semiconductor substrate 10, first variable resistance element 101, second variable resistance element 102, and third variable resistance element 103, in each of which variable resistance layer 12 is sandwiched between first electrode 11 and second electrode 13. Filament 14 is still not formed in any of first variable resistance element 101, second variable resistance element 102, and third variable resistance element 103.

In (b) in FIG. 13A, in each of variable resistance layers 12, part of variable resistance layer 12 changes (e.g., electrical breakdown) through electrical processing called forming, and a filament, which determines the resistance change characteristics of the corresponding variable resistance layer 12 and through which a current mainly flows, is formed. In the formation of the filament, an electrical stress of the same magnitude (e.g., the pulse of voltage V0) is applied to first variable resistance element 101, second variable resistance element 102, or third variable resistance element 103, and identical filament 14s having area S0 and length L is formed.

In (c) in FIG. 13A, in each of variable resistance layers 12, additional electrical processing is performed on filament 14s, and a different one of filaments 14a, 14b, and 14c, which determines the resistance change characteristics of the corresponding variable resistance layer 12 and through which a current mainly flows, is formed. An electrical stress (e.g., voltage V01) is applied to first variable resistance element 101, and filament 14a having area S1 and length L is formed. An electrical stress (e.g., voltage V02 where V02>V01) is applied to second variable resistance element 102, and filament 14b having area S2 and length L is formed. An electrical stress (e.g., voltage V03 where V03>V02) is applied to third variable resistance element 103, and filament 14c having area S3 and length L is formed. Accordingly, it is possible to change a current flowing through a variable resistance element, depending on the area of a filament. In other words, it is possible to keep a filament shape that maintains robust network paths without drastically changing oxygen defect density that greatly affects the data retention characteristics of the variable resistance element, and to set various analog resistance values associated with neural network weights. It is therefore possible to provide a semiconductor device for memory computing which has excellent reliability and less variance in the weights of analog resistance values. Moreover, with the second driving method, it is possible to set or modify weights by a customer after the shipment of a chip, thereby updating network weights for various applications.

Next, a specific example of the second driving method will be described.

Figure 13B:
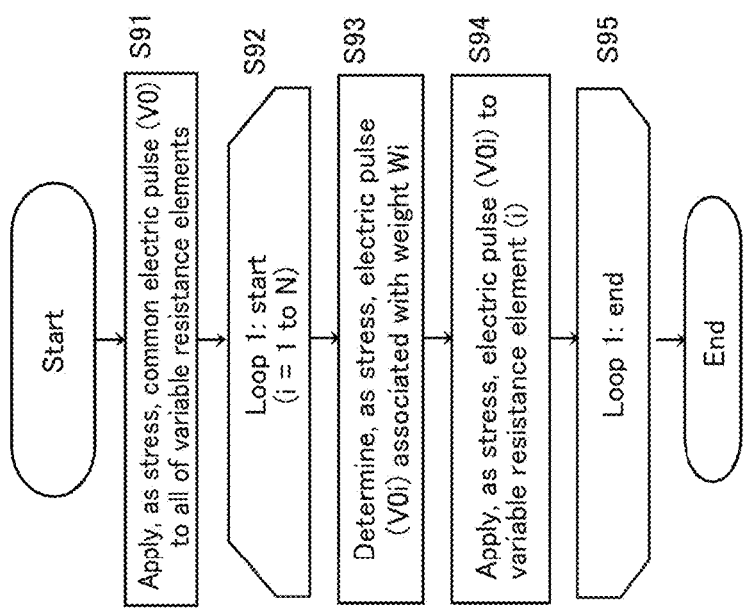
FIG. 13B is a flow chart illustrating a specific example of the second driving method illustrated in FIG. 13A.

FIG. 13B is a flow chart illustrating a specific example of the second driving method illustrated in FIG. 13A. In the diagram, N, i, and Wi denote the same as those indicated in the flow chart in FIG. 10B, V0i denotes the stress of an electric pulse corresponding to i-th variable resistance element 19.

In the diagram, first, a first stage of forming is executed. In other words, common electric pulse V0 is applied, as a stress, to all of variable resistance elements 19 (S91). Accordingly, filament 14s illustrated in (b) in FIG. 13A is formed as a type or an initial type of filament 14 in each of variable resistance elements 19.

Subsequently, in loop 1 (S92 to S95), a second stage of forming is executed. In other words, forming is sequentially performed on N variable resistance elements 19. In loop 1, first, electric pulse V0i associated with weight Wi is determined as a stress (S93). Electric pulse V0i may be determined, for example, by reading out a reference table as illustrated in FIG. 10C.

Furthermore, the determined electric pulse V0i is applied to i-th variable resistance element 19 as a stress (S94).

The stress applied in the forming process in FIG. 13B includes electric pulse V0 that is common to variable resistance elements 19 and electric pulse V0i that is not common to variable resistance elements 19. Electric pulse V0i depends on neural network weight W. Thus, in the second driving method, common electric pulse V0 is applied to variable resistance elements 19, and what is more, electric pulse V0i is sequentially applied to variable resistance elements 19 in the forming process.

Although the magnitude relationship of voltages (V01<V02<V03) is utilized for an electrical stress in FIG. 13A, a pulse width to be applied may be changed while keeping a voltage constant or a current that flows at the time of voltage application may be controlled to change electrical energy to be provided.

Figure 14:
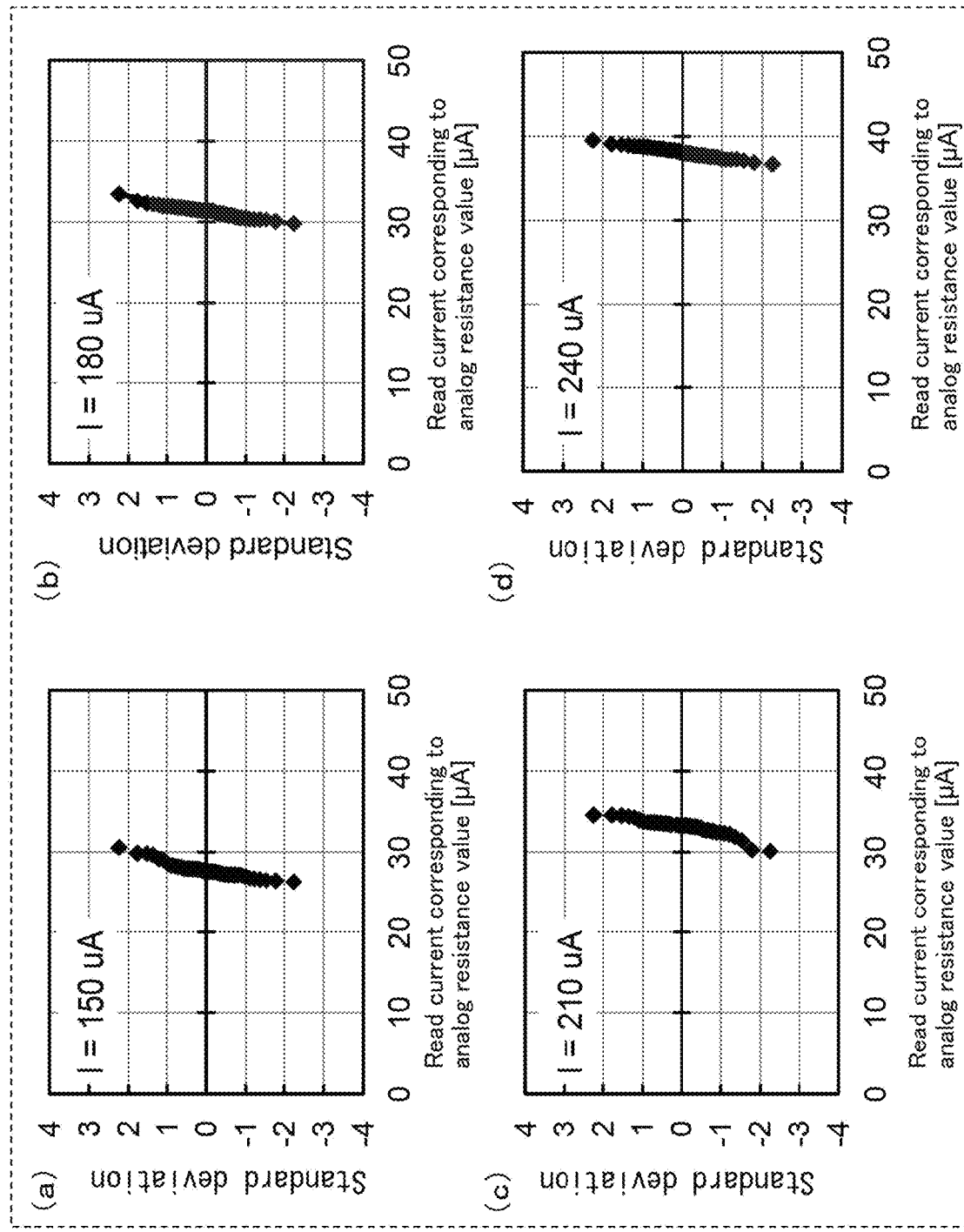
FIG. 14 is a diagram showing how an analog resistance value for an additional forming current is observed using a read current in the second driving method of the semiconductor device according to the first configuration example.

FIG. 14 is a diagram showing how an analog resistance value with respect to an additional forming current is observed using a read current in the second driving method of the semiconductor device according to the first configuration example. Specifically, FIG. 14 shows the result of forming performed by way of controlling, as the stress of an electric pulse, a current value instead of a voltage value. In FIG. 14, identical filament 14s is formed using a common forming current of 100 µA in the first stage (see (b) in FIG. 13A). After that, in the second stage, additional forming current I of (a) 150 µA, (b) 180 µA, (c) 210 µA, or (d) 240 µA is added to a different one of four variable resistance elements 19 to form a filament (see (c) in FIG. 13A).

As can be seen from FIG. 14, a read current corresponding to an analog resistance value monotonously increases in response to an additional forming current, and it is possible to control filament characteristics using an additional forming current.

Figure 15:
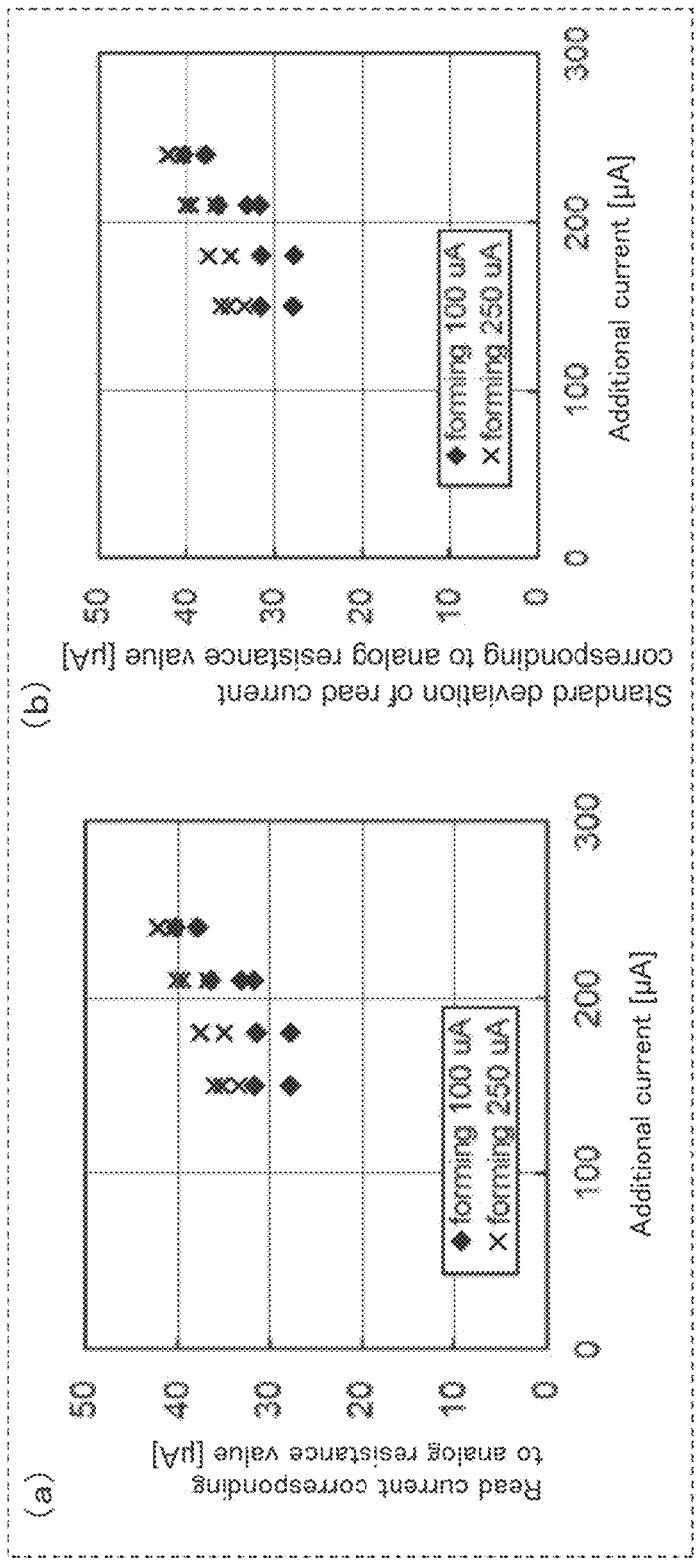
FIG. 15 is a diagram illustrating the relationship between read currents corresponding to analog resistance values for additional currents and variance in the read currents in the second driving method of the semiconductor device according to the first configuration example.

FIG. 15 is a diagram illustrating the relationship between (a) read currents each being equivalent to an analog resistance value with respect to an additional forming current and (b) variance in the read currents in the second driving method of the semiconductor device according to the first configuration example. The diagram also shows that there is no large difference between (i) a variance in read currents associated with analog resistance values obtained in a region in a low resistance state, which is created by allowing the current of 240 µA to flow, and (ii) a variance in read currents associated with analog resistance values obtained in an intermediate region created by allowing the current of 180 µA to flow, and that variance in read currents is greatly improved compared to FIG. 3. Note that even if a forming current to be applied in the stage of (b) in FIG. 13A is increased from 100 µA to 250 µA, the tendency of such characteristics remains unchanged. Since an amount of change varies while the tendency is maintained, this shows that a forming current to be initially applied can be used as an adjustment parameter.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

Any one of the aspects of the present disclosure is useful for semiconductor devices that utilize variable resistance elements for memory computing.

The invention claimed is:
1. A semiconductor device comprising:
variable resistance elements on a semiconductor substrate, wherein
each of the variable resistance elements includes a first electrode, a second electrode, and a variable resistance layer that is sandwiched between the first electrode and the second electrode and that stores a resistance value that is continuously variable,
the variable resistance layer includes a filament whose shape differs according to a neural network weight, and stores, as an analog value, the resistance value that is variable, and
an area of the filament in a plan view of the semiconductor substrate differs according to the neural network weight.
2. A semiconductor device comprising:
variable resistance elements on a semiconductor substrate, wherein each of the variable resistance elements includes a first electrode, a second electrode, and a variable resistance layer that is sandwiched between the first electrode and the second electrode and that stores a resistance value that is continuously variable, the variable resistance layer includes a filament whose shape differs according to a neural network weight, and stores, as an analog value, the resistance value that is variable, and a length of the filament in a direction in which the first electrode and the second electrode face each other differs according to the neural network weight.

3. The semiconductor device according to claim 1, wherein the variable resistance layer includes:
a first resistance layer; and
a second resistance layer that has a resistance value higher than a resistance value of the first resistance layer and includes the filament.

4. The semiconductor device according to claim 2, wherein the first electrode is formed on the semiconductor substrate, and
the variable resistance layer has a resistance value that continuously or stepwisely increases from the second electrode toward the first electrode.

5. A semiconductor device comprising:
variable resistance elements on a semiconductor substrate, wherein
each of the variable resistance elements includes a first electrode, a second electrode, and a variable resistance layer that is sandwiched between the first electrode and the second electrode and that stores a resistance value that is continuously variable, the variable resistance layer includes a filament whose shape differs according to a neural network weight, and stores, as an analog value, the resistance value that is variable, and the resistance value of the variable resistance layer varies due to increase or decrease of oxygen defects with displacement or transfer of oxygen caused by application of an electric pulse.

6. The semiconductor device according to claim 5, wherein the variable resistance layer includes a transitional metal oxide.

7. The semiconductor device according to claim 5, wherein the filament has a current path through which a current flows via oxygen defects, and has redundant current paths that connect an end portion of the filament on a side of the first electrode to an end portion of the filament on a side of the second electrode.

8. The semiconductor device according to claim 7, wherein an oxygen defect density of the filament does not depend on the neural network weight.

9. A semiconductor device comprising:
variable resistance elements on a semiconductor substrate, wherein
each of the variable resistance elements includes a first electrode, a second electrode, and a variable resistance layer that is sandwiched between the first electrode and the second electrode and that stores a resistance value that is continuously variable, the variable resistance layer includes a filament whose shape differs according to a neural network weight, and stores, as an analog value, the resistance value that is variable, and the resistance value of the variable resistance layer varies due to metal ion transfer caused by application of an electric pulse.

10. A semiconductor device comprising:
variable resistance elements on a semiconductor substrate, wherein
each of the variable resistance elements includes a first electrode, a second electrode, and a variable resistance layer that is sandwiched between the first electrode and the second electrode and that stores a resistance value that is continuously variable, the variable resistance layer includes a filament whose shape differs according to a neural network weight, and stores, as an analog value, the resistance value that is variable, and each of resistance values of at least half the variable resistance elements is larger than a median value of analog values assumable by resistance values of the variable resistance elements.

11. A semiconductor device comprising:
variable resistance elements on a semiconductor substrate, wherein
each of the variable resistance elements includes a first electrode, a second electrode, and a variable resistance layer that is sandwiched between the first electrode and the second electrode and that stores a resistance value that is continuously variable, the variable resistance layer includes a filament whose shape differs according to a neural network weight, and stores, as an analog value, the resistance value that is variable, and each of resistance values of at least half the variable resistance elements is smaller than a median value of analog values assumable by resistance values of the variable resistance elements.

12. A semiconductor device driving method of driving a semiconductor device that includes variable resistance elements on a semiconductor substrate, wherein each of the variable resistance elements includes a first electrode, a second electrode, and a variable resistance layer that is sandwiched between the first electrode and the second electrode and that stores a resistance value that is continuously variable, and the variable resistance layer includes a filament whose shape differs according to a neural network weight, and stores, as an analog value, the resistance value that is variable, and the semiconductor device driving method comprises:
determining a stress of an electric pulse associated with the neural network weight; and
in a forming process of forming a filament in the variable resistance layer, forming the filament whose shape differs according to the neural network weight by applying, as the stress, the electric pulse determined.

13. The semiconductor device driving method according to claim 12, wherein at least one of a voltage value, a current value, or an application time of the electric pulse differs according to the neural network weight.

14. The semiconductor device driving method according to claim 12, wherein the stress of the electric pulse includes a first electric pulse that is common to the variable resistance elements and a second electric pulse that is not common to the variable resistance elements and is associated with the neural network weight, and in the forming process, the first electric pulse is applied to the variable resistance layer and the second electric pulse is further applied to the variable resistance layer.

15. The semiconductor device driving method according to claim 14, wherein at least one of a voltage value, a current value, or an application time of the second electric pulse differs according to the neural network weight.

* * * * *